United States Patent [19]

Merkling, Jr. et al.

[11] Patent Number: 4,528,066

[45] Date of Patent: Jul. 9, 1985

[54] SELECTIVE ANISOTROPIC REACTIVE ION ETCHING PROCESS FOR POLYSILICIDE COMPOSITE STRUCTURES

[75] Inventors: Robert M. Merkling, Jr., Gainesville; David Stanasolovich, Manassas, both of Va.

[73] Assignee: IBM Corporation, Armonk, N.Y.

[21] Appl. No.: 628,558

[22] Filed: Jul. 6, 1984

[51] Int. Cl.³ .................. H01L 21/306; B44C 1/22; C03C 15/00; C03C 25/06
[52] U.S. Cl. .................. 156/643; 156/646; 156/651; 156/652; 156/657; 156/659.1; 156/661.1; 156/662; 204/192 EC; 204/192 E; 252/79.1; 427/38
[58] Field of Search .............. 156/643, 646, 651, 652, 156/656, 657, 659.1, 661.1, 662; 252/79.1; 204/192 EC, 192 E; 427/38, 39

[56] References Cited

U.S. PATENT DOCUMENTS

| | | | |
|---|---|---|---|
| 4,333,793 | 6/1982 | Lifshitz et al. | 156/643 |
| 4,411,734 | 10/1983 | Maa | 156/643 |
| 4,432,132 | 2/1984 | Kinsbron et al. | 29/571 |
| 4,436,584 | 3/1984 | Bernacki et al. | 156/643 |
| 4,444,617 | 4/1984 | Whitcomb | 156/643 |

Primary Examiner—William A. Powell
Attorney, Agent, or Firm—John E. Hoel

[57] ABSTRACT

A reactive ion etching technique is disclosed for etching a gate electrode out of layers of tungsten silicide and polycrystalline silicon without etching the underlying layer of silicon dioxide which serves as the gate dielectric and which covers the source and drain regions. The key feature of the invention, wherein the gate, which has been partially etched out of the tungsten silicide and polycrystalline silicon layers, is coated with poly tetrafluoroethylene (teflon) to protect the sidewalls of the gate from being excessively etched in the lateral direction while the etching continues at the bottom on either side of the gate.

The process is especially suitable for formation of tungsten silicide structures since no subsequent thermal steps are required which would otherwise cause a delamination of the tungsten silicide. In addition to eliminating undercutting, the process does not disturb the gate oxide over the source and drain areas, which would otherwise create a leaky device unsuitable for applications such as dynamic RAMs. The entire process can be carried out in a single pump down and therefore contamination levels can be minimized.

14 Claims, 6 Drawing Figures

STEP 4

STEP 1

STEP 2

STEP 3

STEP 4

SELECTIVE ANISOTROPIC REACTIVE ION ETCHING PROCESS FOR POLYSILICIDE COMPOSITE STRUCTURES

DESCRIPTION

1. Field of the Invention

The invention disclosed broadly relates to semiconductor processes and more particularly relates to reactive ion etching techniques in integrated circuit fabrication processes.

2. Background of the Invention

In the evolution of semiconductor fabrication processes, original field effect transistor devices were made by depositing a layer of metal on top of a gate insulator such as silicon dioxide. As device dimensions continued to decrease, it became more and more difficult to obtain good registration between the gate electrode structure and the edges of the source and drain diffusions in the silicon substrate. The prior art then evolved into the self-aligned silicon gate processes wherein the gate electrode was formed of a refractory material such as polycrystalline silicon which was deposited on top of a thin silicon dioxide gate insulator layer. This step would then be followed by the ion implantation of the source and drain regions into the silicon substrate, making use of the dimensions represented by the pre-existing gate structure, to define the edges of the resultant source and drain regions. This was called self-aligned silicon gate technology. As the technology further evolved, it was found that the relative conductivity of the polycrystalline silicon material which was employed not only as gate electrode structures but also as interconnection circuitry, was not sufficient to enable the efficient conduction of electrical currents. Thus, the technology evolved into the deposition of composite layers for the gate structure and the signal line interconnection structure. Typically, a layer of polycrystalline silicon was deposited followed by a layer of a refractory metal or metal silicide such as tungsten silicide. The higher conductivity of the tungsten silicide in the composite would enable improved conductivity for the electrical currents which had to be conducted therein. Reference to FIG. 1 will illustrate a cross-sectional view of such a composite of polycrystalline silicon layer 16 and tungsten silicide layer 18 on top of the silicon dioxide gate insulator layer 14 on a silicon substrate 10. The device region would be determined by the edges of the recessed oxide layers 12, and it is in that device region 13 that the field effect transistor device is to be formed by etching out the gate structure from the polycrystalline silicon layer 16 and tungsten silicide layer 18.

Reference can now be made to FIG. 2 which shows the result of a typical prior art approach to forming the gate electrode structure 15. Typically, the thin oxide insulating layer 14 was approximately 250 angstroms in thickness, the polycrystalline silicon layer 16 was approximately 1500 angstroms in thickness, and the tungsten silicide layer 18 was approximately 2500 angstroms in thickness. On top of the tungsten silicide layer 18 there would typically be formed a patterned photolithographic layer of photoresist 20 whose outline dimensions would approximate the desired outline dimensions of the resultant gate electrode 15. In the prior art, reactive ion etching techniques would be employed using as a typical etchant, carbon tetrafluoride. The carbon tetrafluoride would be maintained at a pressure of approximately 25 milliTorr (mT) in a reactive ion etching chamber. Typical prior art reactive ion etching chambers apply a radio frequency field having a frequency of typically 13.56 MHz. In this RF field, the carbon tetrafluoride molecules would dissociate forming ionic species and neutral species which included carbon polyfluoride ($CF_x$) and fluorine. As is well-known in the prior art, any grounded element exposed to a positively charged plasma will acquire a net negative DC potential based on electrostatic principles. Thus, the positively charged ions of the etchant are attracted to this self-biased negative potential on the workpiece, such as the semiconductor wafer which is exposed to the plasma in the reactive ion etching chamber. Typically, $CF_3+$ ions are attracted to the workpiece and etch the silicon dioxide exposed. Fluorine ions are typically negatively charged and therefore are typically not in the vicinity of the workpiece. However, neutral and positively charged fluorine are attracted to the negatively biased workpiece and etch the silicon and the tungsten silicide which are exposed. Since neutrally charged fluorine atoms, molecules and free radicals outnumber positively charged fluorine ions in the vicinity of the negatively biased workpiece, and since these neutrally charged fluorine constituents are not dramatically influenced by the DC electric field in the vicinity of the workpiece, they tend to etch isotropically (in all directions), thereby producing poorly defined structures. Reference to FIG. 2 will illustrate the result of such poor directionality in the typical prior art reactive ion etching process. As can be seen, because of the poor directionality, the sidewalls 24 of the polycrystalline silicon layer 16 and the tungsten silicide layer 18 are undercut. This reduces the desired cross-sectional area for the current conducting electrode, thereby producing hot spots and possible catastrophic failure in the resultant integrated circuit device. In order to enhance the directionality, prior art workers would reduce the pressure of the ambient, thereby increasing the mean free path of flight and therefore the average kinetic energy per collision for the etchant ions. This would enhance the directional etching over the nondirectional etching action. However, by virtue of the higher kinetic energy, a greater amount of energy was available for any chemical reaction which would result once the etchant molecule came in contact with the workpiece molecule or atom. Therefore, little selectivity was maintained between the rate of etching for silicon and the rate of etching for silicon dioxide. Therefore, as can be seen in FIG. 2, over etching would frequently occur in the vertical direction so that the silicon dioxide gate insulator layer 14 would be etched completely through and a substantial portion (up to 1000 angstroms) of the silicon material on either side of the gate electrode 15, would be removed. The problem which would arise with this configuration, as shown in FIG. 2, is that undesirable charge states would be created in the resultant surface of the silicon adjacent to the gate electrode. This would result in poor field effect transistor properties and electrically deep junctions. Electrically deep junctions create the short channel effects which are undesirable for small dimensioned FET devices, as is well-known in the prior art.

OBJECTS OF THE INVENTION

It is therefore an object of the invention to provide an improved process for forming gate electrode structures in field effect transistor devices.

It is another object of the invention to provide an improved semiconductor fabrication process for forming composite gate electrode structures in field effect transistor devices.

It is still a further object of the invention to provide an improved semiconductor fabrication process which has a greater directionality and a greater selectivity in the etching of composite gate electrode structures for field effect transistor devices.

SUMMARY OF THE INVENTION

These and other objects, features and advantages of the invention are accomplished by the fabrication process disclosed herein. A four-step process is disclosed. The first step involves the use of a mixture of carbon tetrafluoride or an equivalent etching component mixed with a portion of molecular hydrogen or other suitable component which will getter the free fluorine produced in the reactive ion etching chamber. By gettering the free fluorine, anisotropic (directional) etching can be achieved. Step 1 is continued so that the tungsten silicide and polycrystalline silicon layers are etched almost completely through, but a residual 500 angstrom to 1000 angstrom thick layer of polycrystalline silicon is left at the bottom of the etched portions. The second step in the process then employs a mixture of the carbon tetrafluoride etchant and a higher proportion of hydrogen or other suitable component which will more extensively getter the fluorine ions, atoms and molecules. The resultant fluorine deficient ambient will result in the production of a layer of a fluorocarbon polymer on all exposed surfaces. The third step in the process provides for the removal of the protective fluorocarbon polymer layer from horizontal surfaces which are desired to be etched. A composition of, for example 50 percent molecular hydrogen and 50 percent molecular nitrogen is introduced to the reactive ion etching chamber at a relatively low pressure. This will enable a highly directional reactive ion etching of the polymer layer on horizontal exposed surfaces. Vertical exposed surfaces will not be etched as extensively because of the directionality of the etching ions, and therefore a protective coating remains on all vertical exposed surfaces, such as the sidewalls of the desired resultant gate electrode structure. The fourth step of the process then introduces carbon tetrafluoride or other suitable etchant and a small portion of oxygen into the chamber. This etchant removes the residual horizontal layer of polycrystalline silicon at the bottom of the etched areas, however it has a high selectivity for silicon and will not significantly etch the underlying silicon dioxide gate insulator layer. As a result, a very precisely defined gate electrode structure made up of composite layers of polycrystalline silicon and tungsten silicide, is formed without damage to the silicon substrate lying on either side of the gate electrode structure.

DESCRIPTION OF THE FIGURES

These and other objects, features and advantages of the invention can be more fully appreciated with reference to the accompanying figures.

DISCUSSION OF THE PREFERRED EMBODIMENT

Figure 1:
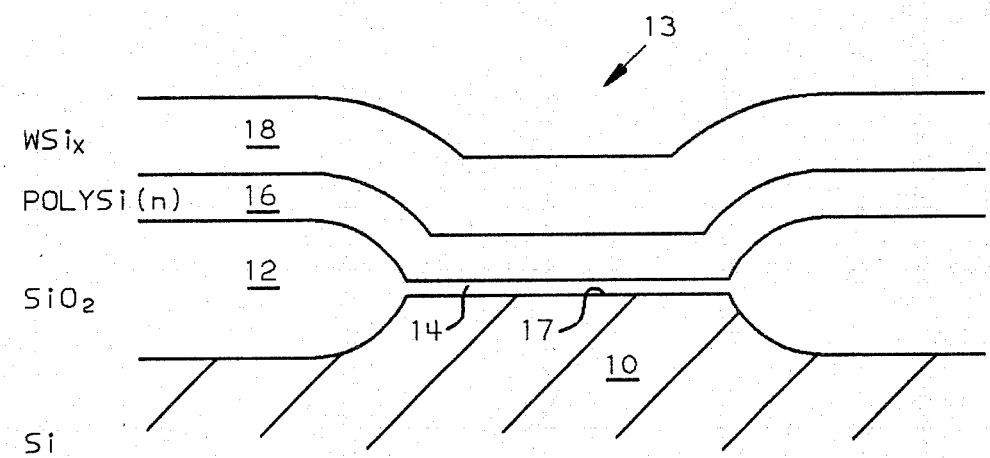
FIG. 1 is a cross-sectional view of a beginning stage in the inventive process, wherein a layer of polycrystalline silicon 16 and a layer of tungsten silicide 18 have been deposited over the silicon dioxide gate insulator layer 14 on the silicon substrate 10.
Figure 2:
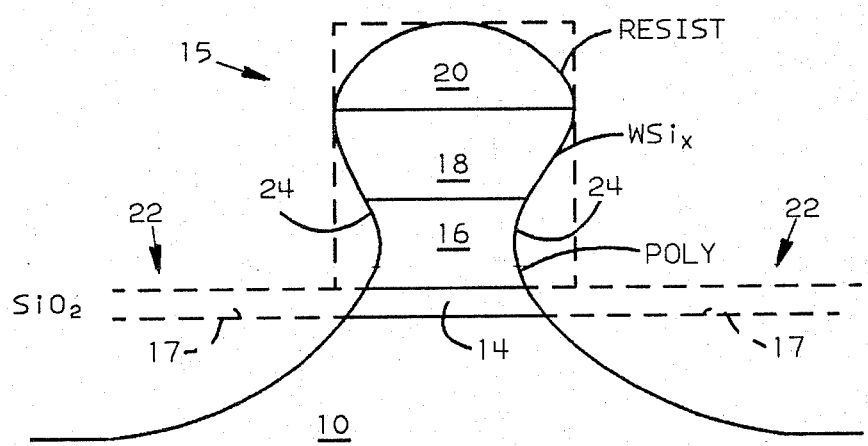
FIG. 2 is a view of the result of a prior art process for the formation of a gate electrode in an FET device.

FIG. 1 illustrates the starting point for the inventive process disclosed herein. A silicon substrate 10 has had formed on its surface a recessed silicon dioxide layer 12, the edges of which form the device region 13. On the surface 17 of the silicon substrate 10 in the device region 13, a thin layer of silicon dioxide 14 is formed. Typically the silicon dioxide layer 14 has a thickness of approximately 250 angstroms and serves as the gate insulator layer in the final FET device. On top of the silicon dioxide layer 14 is deposited a layer of polycrystalline silicon 16 which typically has a thickness of approximately 1500 angstroms. The polysilicon layer 16 can typically be doped with phosphorus to form an N-type conductivity. Thereafter, a layer of a mixture of tungsten and silicon 18 can be formed on the surface of the polycrystalline silicon layer 16. In a subsequent high temperature sintering step, the tungsten silicide constituents in the layer 18 will be alloyed so as to form a tungsten silicide alloy.

Figure 3:
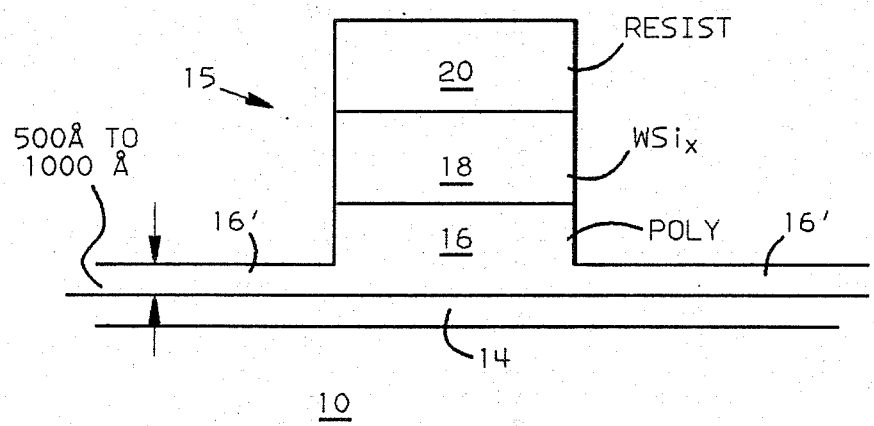
FIG. 3 illustrates the first step in the inventive process, wherein an anisotropic (directional) etching step is carried out.

FIG. 3 illustrates the first step in the inventive process wherein an anisotropic (directional) etching step is carried out to etch through all of the tungsten silicide layer 18 which is desired to be removed and most of the polycrystalline silicon layer 16 which is desired to be removed. This is performed by introducing as an etching gas a mixture of carbon tetrafluoride and approximately 11 percent by volume of molecular hydrogen. The pressure of the etchant gas mixture is maintained at approximately 10 milliTorr and the power per unit area for the RF field is maintained at approximately 0.24 watts per square centimeter. The objective of the mixture of the etchant gas is to provide a highly directional reactive ion etch. In order to do this, reliance is placed upon the molecular hydrogen to chemically combine with the free fluorine produced in the chamber. Free fluorine, if not otherwise sequestered, will isotropically (nondirectionally) etch silicon and tungsten silicide surfaces. This will produce an undesirable undercutting which is to be avoided. Therefore, the molecular hydrogen is introduced to combine with the free fluorine to getter the fluorine so that the primary etching mechanism is ionized carbon trifluoride or carbon difluoride which is propelled in a vertical direction to contact and etch the exposed tungsten silicide and polycrystalline silicon layers 18 and 16.

Other fluorine bearing etchant species can be employed to obtain the highly directional etching desired in this first step. For example, $CHF_3$—$H_2$ ($H_2$ less than 10 percent); $C_2F_6$—$H_2$ ($H_2$ less than 25 percent); or other fluorine deficient plasma producing constituents. The unifying principle is that the hydrogen present will bind up the fluorine, thereby reducing the amount of free fluorine which can isotropically etch.

As can be seen in FIG. 3, the first step anisotropic etching process is stopped at a point where from 500 angstroms to 1000 angstroms of residual polycrystalline silicon layer 16' remains on the surface of the silicon dioxide layer 14 in the regions desired to be etched. This end point detection is performed in the conventional manner. For example, many state-of-the art reactive ion etching chambers include optical spectroscopy or laser interferometric measurement tools which enable the operator to reliably detect an end point for etching, such as that shown in FIG. 3. The reason for stopping the etching process of step 1 before the polycrystalline layer 16 is completely etched through, is that the etching composition used in step 1 has a poor selectivity, and will not adequately distinguish between silicon dioxide and silicon in its etching rate.

Another consideration and problem in the prior art is the degree of erosion of the photoresist layer 20 when exposed to prior art reactive ion etching compositions. Typically, the free fluorine present in the ambient of the etching chamber attacks the organic photoresist composition in layer 20, thereby reducing the precise delineation of the shape for the resultant structure to be formed. By gettering much of the free fluorine through the use of the molecular hydrogen as described for step 1 of the inventive process, less erosion is suffered for the resist layer 20. Therefore, a more sharply delineated resist image is maintained during the etching process.

Figure 4:
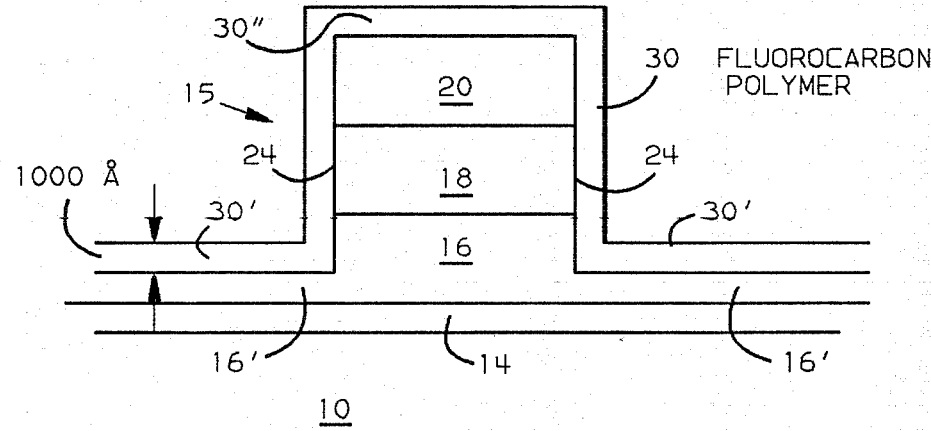
FIG. 4 illustrates the second step in the inventive process, wherein the formation of a fluorocarbon polymer is carried out.

Turning now to FIG. 4, the second step in the inventive process is disclosed, wherein the formation of a fluorocarbon polymer is obtained for all exposed surfaces. In order to accomplish this, a significantly greater degree of gettering for the fluorine constituents in the ambient of the chamber is required. In order to accomplish this, the composition of the etchant gas mixture is modified to increase the proportion of molecular hydrogen. For example, a composition of carbon tetrafluoride and 42 percent by volume of molecular hydrogen has been found to be suitable for the preferential deposition of a fluorocarbon polymer on all exposed surfaces. This fluorocarbon polymer deposition process is further enhanced by increasing the pressure of the ambient to approximately 500 milliTorr and reducing the power level for the RF energy to 0.05 watts per square centimeter. In this manner, a layer of fluorocarbon polymer 30 is deposited on the vertical sidewalls of the gate structure 15, a layer of fluorocarbon polymer 30' is deposited on the horizontal surfaces at the bottom of the areas to be etched, and a layer 30" of fluorocarbon polymer is deposited on the top surface of the resist layer 20. The purpose of depositing the fluorocarbon polymer layer 30 is to protect the sidewalls 24 of the gate electrode structure from inadvertent etching by any free fluorine which happens to be in the vicinity and has not been adequately gettered by the molecular hydrogen, during the subsequent polysilicon etching step.

Figure 5:
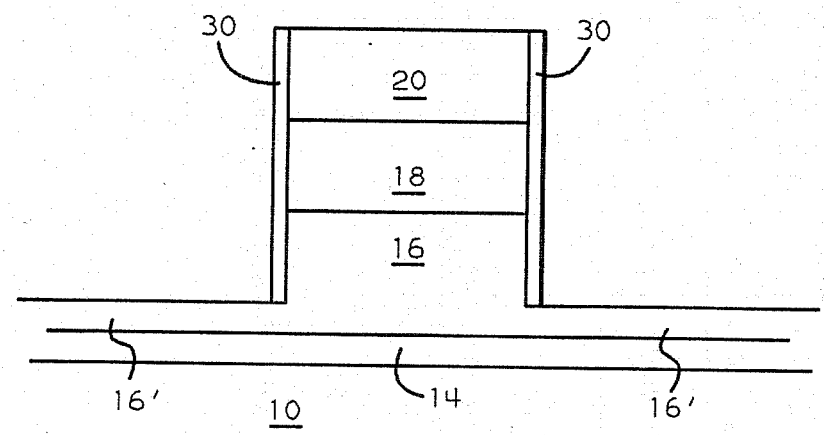
FIG. 5 is an illustration of the third step in the inventive process, wherein the directional removal of the fluorocarbon polymer is carried out on all horizontal surfaces.

Turning now to FIG. 5, step 3 of the inventive process performs the directional removal of the horizontal portions 30' and 30" of the polymer layer 30. In order to accomplish this, a suitable etchant gas mixture is introduced into the chamber which will remove the fluorocarbon polymer. An example of such a composition is 50 percent molecular hydrogen and 50 percent molecular nitrogen. This composition is introduced at a pressure of approximately 10 milliTorr, in order to provide the high directionality which is desired. A power level of approximately 0.24 watts per square centimeter is maintained. In this manner, the horizontal layers 30' and 30" of the fluorocarbon polymer are removed from all horizontal surfaces. The result of this step is shown in FIG. 5.

Figure 6:
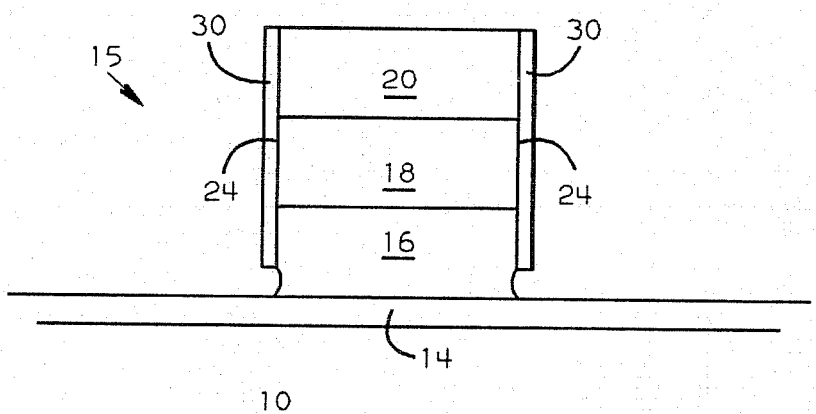
FIG. 6 is an illustration of a fourth step in the inventive process, wherein the residual polycrystalline silicon layer 16' is removed from the bottom portion of each etched area.

FIG. 6 illustrates the fourth step in the inventive process, providing for the removal of the residual polycrystalline silicon layer 16' at the bottom horizontal surface of the areas to be etched. This is achieved by introducing an etching composition of carbon tetrafluoride and approximately nine percent by volume of molecular oxygen. This composition is provided since it will not etch in any substantial way, any exposed silicon dioxide layers. However, at a pressure of approximately 100 milliTorr and a power density of approximately 0.10 watts per square centimeter, the etchant does not have a very good directionality, and therefore there is some slight undercutting at the very base of the polycrystalline silicon layer 16 where the polycrystalline silicon residual portion 16' is removed. However, the undercutting is slight and is not considered harmful. As can be seen in FIG. 6, the remaining fluorocarbon polymer layer 30 on the sidewalls 24 of the gate electrode structure 15 protects the sidewalls 24 from any further etching by the etchant composition in step 4 of FIG. 6. As a result, the resulting gate electrode structure 15 has a full, designed-for cross-section which enables relatively high current conduction to be maintained.

The resulting inventive process provides a well-defined precisely dimensioned gate electrode structure while at the same time preventing any unwanted etching of the silicon substrate in the region surrounding the gate electrode structure.

Although a specific etching composition, pressures and power densities have been described above, other compositions and process parameters can be employed without departing from the spirit of the invention. For example, the gate electrode composite structure 15 can be a layer of polycrystalline silicon 16 which has a refractory metal silicide layer 18 on top of it. Such suitable refractory metal silicides can be in addition to tungsten silicide, tantalum silicide, molybdenum silicide, titanium silicide, and niobium silicide. With regard to possible alternate etching gas compositions for producing the polymer layer in step 2 described above, the following alternate compositions can be employed as substituting for the preferred embodiment of $CF_4$—42 percent $H_2$. Alternate compositions can include $CF_4$—$H_2$ where the proportion of $H_2$ can be any proportion greater than 40 percent and less than 75 percent by volume. Other alternate compositions can include $C_2F_6$—$H_2$ where the $H_2$ proportion is greater than 25 percent by volume. Also, $CHF_3$—$H_2$ where the $H_2$ proportion is greater than 10 percent by volume. In addition, $C_3F_8$ without the addition of any additional $H_2$. Still further, $CH_2F_2$ can be employed or $CH_3F$ can be employed, each without the addition of any additional $H_2$. Another alternate composition is $CHF_3$—$C_2F_6$, wherein the $C_2F_6$ proportion is greater than 20 percent. Still another alternate composition is $C_2H_2$—$C_2F_6$ where the $C_2F_6$ proportion is greater than 40 percent by volume. Each of the above alternate compositions behaves under the unifying principle that free fluorine is bound up, thereby increasing the tendency to form the polymer. Indeed, the greater the carbon-to-fluorine atomic ratio in the compositions, the greater will be the tendency to form a polymer.

Other alternate compositions for the etchant which will directionally etch the polymer in step 3, include molecular oxygen, molecular hydrogen, molecular nitrogen, a mixture of molecular hydrogen and molecular nitrogen, and molecular ammonia. A unifying principle for the selection of these etching compositions is that they be introduced at a relatively low pressure of less than 25 milliTorr. The relatively low pressure increases the mean free path for the ions in the etching chamber, thereby enhancing the directionality of their etching action.

Although a specific embodiment of the invention has been disclosed, it will be understood by those of skill in the art that the foregoing and other changes in form and details may be made therein without departing from the spirit and the scope of the invention.

We claim:

1. A reactive ion etching process for etching a composite layer structure including a first layer of polycrystalline silicon and a second superincumbent layer of a refractory metal silicide having a patterned portion exposed through an etching mask, comprising the steps of:
   etching with an anisotropic etching composition including a fluorocarbon etchant species and a fluorine gettering species, to etch completely through said refractory metal silicide layer and partially through said polycrystalline silicon layer, leaving said patterned portion unetched;
   forming a fluorocarbon polymer on the horizontal and vertical surfaces of said patterned portion and on either side of said patterned portion;
   directionally etching said portions of said fluorocarbon polymer deposited on horizontal surfaces of said patterned portion and on horizontal surfaces on either side of said patterned portion;
   etching to remove said residual horizontal portion of said polycrystalline silicon layer on either side of said patterned portion;
   whereby a precisely defined vertical sidewall pattern structure is formed without etching portions of the workpiece on either side of said patterned portion.

2. The process of claim 1, wherein said anisotropic etching step further comprises:
   applying a mixture of carbon tetrafluoride and molecular hydrogen as said anisotropic etching composition.

3. The process of claim 2, wherein said anisotropic etching step etches partially through said polycrystalline silicon layer, leaving a residual 500–1000 angstrom thick layer of polycrystalline silicon at the bottom of the etched portions.

4. The process of claim 1, wherein said step of forming a fluorocarbon polymer, further comprises:
   applying a mixture of carbon tetrafluoride and a relatively large proportion of hydrogen sufficient to extensively getter the fluorine ions, atoms and molecules in the mixture, resulting in the production of a layer of fluorocarbon polymer on all exposed surfaces.

5. The process of claim 1, wherein said step of directionally etching portions of said fluorocarbon polymer, further comprises:
   applying a mixture of approximately 50 percent molecular hydrogen and 50 percent molecular nitrogen at a relatively low pressure, enabling a highly directional reactive ion etching of said fluorocarbon polymer on horizontal exposed surfaces.

6. The process of claim 1, wherein said step of etching to remove said residual horizontal portion of said polycrystalline silicon layer, further comprises:
   applying a mixture of carbon tetrafluoride and a relatively small portion of oxygen as an etchant to remove the residual horizontal portion of said polycrystalline silicon layer at the bottom of the etched areas.

7. The process of claim 2 which further comprises:
   said etching gas mixture being composed of carbon tetrafluoride and approximately 11 percent by volume of molecular hydrogen at a pressure of approximately 10 milliTorr and a radio frequency power per unit area of approximately 0.24 watts per square centimeter.

8. The process of claim 1, wherein said step of anisotropically etching, employs an etchant species selected from the group consisting of $CHF_3$—$H_2$ ($H_2$ less than 10 percent), $C_2F_6$—$H_2$ ($H_2$ less than 25 percent), and other fluorine deficient plasma producing constituents having fluorine in their molecular structure which will be bound up by the fluorine gettering species, thereby reducing the amount of free fluorine which can isotropically etch.

9. The process of claim 1, wherein said step of forming a fluorocarbon polymer, further comprises:
   applying an etchant gas mixture having the composition of carbon tetrafluoride and approximately 42 percent by volume of molecular hydrogen, at a pressure of approximately 500 milliTorr and a radio frequency power level of approximately 0.05 watts per square centimeter.

10. The process of claim 1, wherein said step of directionally etching said fluorocarbon polymer, further comprises:
    applying an etchant mixture composed of approximately 50 percent molecular hydrogen and approximately 50 molecular nitrogen at a pressure of approximately 10 milliTorr and a radio frequency power level of approximately 0.24 watts per square centimeter.

11. The process of claim 1, wherein said step of etching to remove said residual horizontal portion of said polycrystalline silicon layer, further comprises:
    applying an etching composition of carbon tetrafluoride and approximately 9 percent by volume of molecular hydrogen at a pressure of approximately 100 milliTorr and a power density of approximately 0.10 watts per square centimeter.

12. The process of claim 1, wherein said composite layer structure can be composed of a first layer of polycrystalline silicon and a second layer of a refractory metal silicide having a composition selected from the group consisting of tungsten silicide, tantalum silicide, molybdenum silicide, titanium silicide, and niobium silicide.

13. The process of claim 1 wherein said step of forming said fluorocarbon polymer is carried out by applying a composition selected from the group consisting of $CF_4$—42 percent $H_2$; $CF_4$—$H_2$ where the proportion of $H_2$ can be greater than 40 percent and less than 75 percent by volume; $C_2F_6$—$H_2$ where the $H_2$ proportion is greater than 25 percent by volume; $CHF_3$—$H_2$ where the $H_2$ proportion is greater than 10 percent by volume; $C_3F_8$; $CH_2F_2$; $CH_3F$; $CHF_3$—$C_2F_6$ wherein the $C_2F_6$ proportion is greater than 20 percent; and $C_2H_2$—$C_2F_6$ where the $C_2F_6$ proportion is greater than 40 percent by volume; each of said compositions having the property that free fluorine is bound up, thereby increasing the tendency to form the fluorocarbon polymer.

14. The process of claim 1, wherein said step of directionally etching said fluorocarbon polymer, is carried out by applying a composition selected from the group consisting of molecular oxygen, molecular hydrogen, molecular nitrogen, a mixture of molecular hydrogen and molecular nitrogen, and molecular ammonia; each of said compositions being introduced at a relatively low pressure of less than 25 milliTorr, thereby enhancing the directionality of their etching action.

* * * * *

UNITED STATES PATENT AND TRADEMARK OFFICE
CERTIFICATE OF CORRECTION

PATENT NO. : 4,528,066
DATED : July 9, 1985
INVENTOR(S) : R. M. Merkling, Jr., et al.

It is certified that error appears in the above-identified patent and that said Letters Patent are hereby corrected as shown below:

Claim 11, Col. 8, Line 48 - Change "Torrand" to --Torr and--.

Signed and Sealed this

Fifth Day of November 1985

[SEAL]

Attest:

DONALD J. QUIGG

Attesting Officer

Commissioner of Patents and Trademarks